United States Patent

Huang

[11] Patent Number: 6,103,622
[45] Date of Patent: Aug. 15, 2000

[54] SILICIDE PROCESS FOR MIXED MODE PRODUCT WITH DUAL LAYER CAPACITOR AND POLYSILICON RESISTOR WHICH IS PROTECTED WITH A CAPACITOR PROTECTIVE OXIDE DURING SILICIDATION OF FET DEVICE

[75] Inventor: Jenn Ming Huang, Hsin-chu, Taiwan

[73] Assignee: Taiwan Semiconductor Manufacturing, Hsin-Chu, Taiwan

[21] Appl. No.: 09/282,063

[22] Filed: Mar. 29, 1999

Related U.S. Application Data

[62] Division of application No. 08/990,269, Dec. 15, 1997.
[51] Int. Cl.$^7$ .................. H01L 21/8242; H01L 21/44
[52] U.S. Cl. .................. 438/652; 438/239; 438/241; 438/656; 438/682; 438/683
[58] Field of Search .................. 438/652, 656, 438/682, 683, 239, 241

[56] References Cited

U.S. PATENT DOCUMENTS

| | | | |
|---|---|---|---|
| 5,010,032 | 4/1991 | Tang et al. | 437/57 |
| 5,604,145 | 2/1997 | Hashizume et al. | 437/52 |
| 5,614,111 | 3/1997 | Lavene | 219/121.59 |
| 5,631,188 | 5/1997 | Chang et al. | 438/253 |
| 5,924,011 | 3/2000 | Huang . | |
| 6,033,950 | 3/2000 | Chen et al. . | |

OTHER PUBLICATIONS

S. Wolf et al, "Silicon Processing for the VLSI Era", vol. 1 Lattice Press, Sunset Beach, CA, 1986, p. 386.544.
S. Wolf et al, "Silicon Processing for the VLSI Era" vol. 2, Lattice Press, Sunset Beach, CA, 1990, p. 384.

*Primary Examiner*—Richard Booth
*Assistant Examiner*—Ron Pompey
*Attorney, Agent, or Firm*—George O. Saile; Stephen B. Ackerman

[57] ABSTRACT

A method is disclosed for fabricating mixed analog/digital devices without incurring detrimental effects of high temperature forming of analog components such as capacitor and resistor on the silicide contacts of digital devices. Conversely, the possible adverse effects of silicide formation on the analog components is circumvented. These are accomplished by performing the silicidation of the FET device after forming the two electrode plates of the dual layer capacitor while protecting the capacitor with a capacitor protective oxide (CPO). In a second embodiment, local polysilicon (poly-Si) interconnect is formed simultaneously with the formation of the second plate of the capacitor, and the local interconnect is silicidated subsequently and simultaneously with the silicidation of the polysilicon gate and areas above the source/drain regions. In still another third embodiment, a high-value resistor is formed simultaneously with the forming of the second polysilicon electrode of the capacitor. The resistor is protected along with the capacitor by means of the CPO while the FET device area is silicidated.

21 Claims, 6 Drawing Sheets

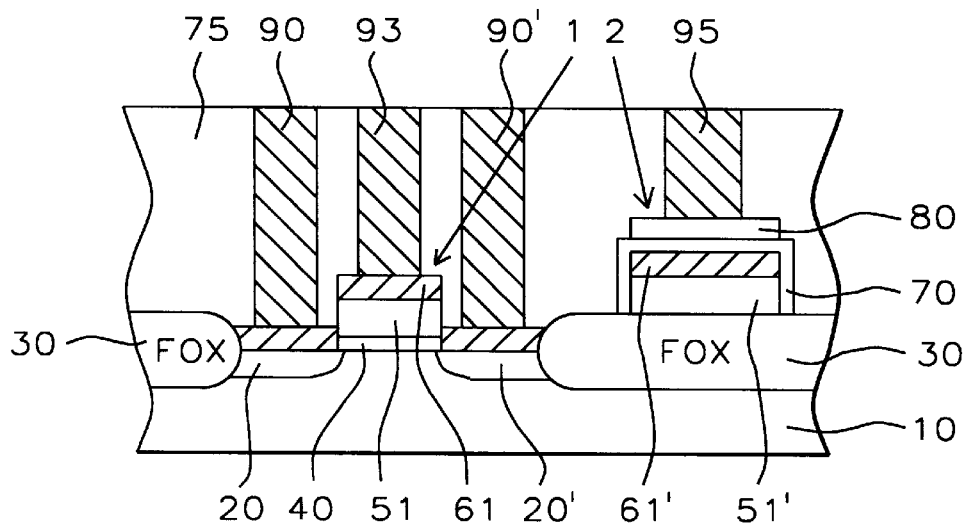
FIG. 1a – Prior Art
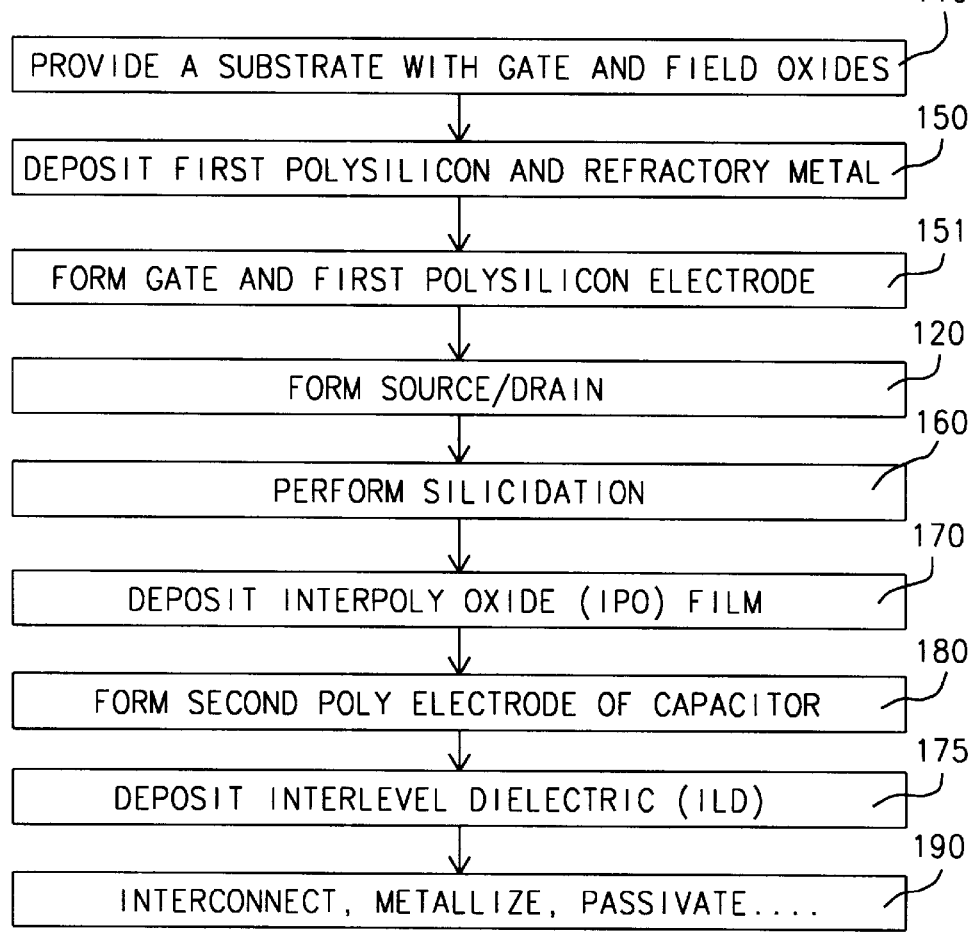
FIG. 1b – Prior Art

SILICIDE PROCESS FOR MIXED MODE PRODUCT WITH DUAL LAYER CAPACITOR AND POLYSILICON RESISTOR WHICH IS PROTECTED WITH A CAPACITOR PROTECTIVE OXIDE DURING SILICIDATION OF FET DEVICE

This is a division of patent application Ser. No. 08/990,269, filing date Dec. 15, 1997, Silicide Process For Mixed Mode Product, assigned to the same assignee as the present invention.

BACKGROUND OF THE INVENTION (1) Field of the Invention

The present invention relates to manufacturing of semiconductor devices in general, and in particular, to a silicide process for fabricating mixed mode, analog/digital (A/D) chips.

(2) Description of the Related Art

With the advent of ultra scale integration (ULSI), circuit features are continuing to shrink to ½ micrometer ($\mu$m) or less. Consequently, the resistance and capacitance (RC) associated with interconnection paths in integrated circuits becoming more and more critical. This is particularly true with CMOS devices, in which the RC delay due to the interconnect paths can exceed the delays due to gate switching. As is well known, the higher the value of the interconnect RC constant, the more likely is the circuit operating speed to be limited by this delay. In other words, low resistivity interconnection paths are critical in order to fabricate dense, high performance devices.

There are several approaches to reduce the interconnect resistivity as explained in S. Wolf and R. N. Tauber, "Silicon Processing for the VLSI Era," vol. 2, Lattice Press, Sunset Beach, Calif., 1990, p. 384. One approach, for example, is to replace the commonly used interconnect material polysilicon with low resistance refractory metals. It will be known to workers in the field that polysilicon has replaced aluminum as an interconnect material because it can withstand high process temperatures, but it is a high resistance material. Refractory metals have adequately high melting temperatures, but their oxides are typically of poor quality. Thus, usually, a multilayer structure, called polycide, consisting of a low resistance refractory metal silicide on top of a doped polysilicon layer is formed for use as an interconnect. The refractory metal on the polysilicon is converted to a metal silicide by subjecting the multilayer structure to heat.

The silicide process, or silicidation, gains a special importance in integrated circuits containing both analog and digital circuits where interconnections are used between these two different types of circuits. For example, counter-diffusion of different types of dopants through poor and degraded silicide interconnects can be a problem. At the same time, ability to produce both types of circuit functions on the same chip can provide significant benefits. For example, CMOS (complimentary metal-oxide semiconductor), as is well known, can be used to minimize dc power dissipation and provide high-impedance FET (field effect transistor) inputs for certain functions while bipolar devices can provide high current gain capabilities. BiCMOS technology can take advantage of these special characteristics of both types of circuits, and permit the simultaneous fabrication of high-performance analog and digital functions on the same chip. It is also well known that high-performance capacitors play a significant role in BiCMOS chips, especially in the areas of A/D converters and switched-capacitor filters. (See S. Wolf and R. N. Tauber, "Silicon Processing for the VLSI Era," vol. 2, Lattice Press, Sunset Beach, Calif., 1990, p. 544).

A common type of capacitor typically formed within an analog integrated circuit is a dual layer polysilicon capacitor. Dual layer polysilicon capacitors are formed from two substantially planar conductive polysilicon electrodes separated by a dielectric layer. Dual layer polysilicon capacitors provide several advantages when used within chips having integrated analog and digital circuits. In addition, methods for forming dual layer polysilicon capacitors usually provide efficient manufacturing processes since the same one layer of the dual polysilicon capacitor can be used to form other polysilicon structures at other locations within the same integrated circuit. For example, it is common to form polysilicon or polycide gate electrodes within FET devices simultaneously with forming polysilicon or polycide contact within bipolar transistor electrodes on the same chip.

FIG. 1a shows the structure of a conventional dual layer polysilicon capacitor formed on semiconductor substrate (10). Active regions (20) and (20') in the substrate are defined by passive (isolation) regions (30) formed in and on the same substrate as shown in the same Figure. After the formation of the active and passive regions, a thin layer of oxide (40) is grown usually thermally followed by deposition of a first polysilicon layer (50) and then metal layer (60), though these layers are not shown in FIG. 1a. What are shown in the figure are columnar structures (1) and (2) that are formed from these layers respectively, by using the well-known techniques of masking and etching; namely, metal cap (61) over an FET polysilicon gate (51) separated from active region by gate oxide (40), and similarly, metal cap (61') over a first polysilicon electrode of a dual layer polysilicon capacitor residing over isolation region (30) where thermal oxide is also a part. Metal caps (61) and (61'), are next subjected to heating to react with silicon in polysilicon portions (51) and (51') to form silicide with polysilicon, or polycide. The metal is usually selected from a refractory group consisting of tungsten, titanium, tantalum, molybdenum, and platinum and can either be deposited as a pure metal on a silicon bearing surface, or co-evaporated with silicon. Silicides have the characteristics of low electrical resistivity, ease of formation, smooth surface features and good corrosion resistance (See S. Wolf and R. N. Tauber, "Silicon Processing for the VLSI Era," vol. 1, Lattice Press, Sunset Beach, Calif., 1990, p. 386). Following the silicide formation, active regions are implanted with impurities to form the source/drain regions (20) and (20') shown in FIG. 1a.

Thus, at the same time that an FET (1) polycide gate (1) is formed, the first polysilicon electrode of a dual layer polysilicon capacitor (2) is also formed. Subsequently, formed upon the patterned metal silicide layer (61') is a patterned insulator layer (70), and formed upon the patterned insulator layer (70) is a patterned second polysilicon layer (80) The patterned second polysilicon layer (80) forms the second polysilicon electrode of the dual layer polysilicon structure of FIG. 1a. Further processing then takes place to complete the circuit, by continuing with steps well known in the art, that is, by forming interconnects (90) and (90') to source/drain regions (20), (20'), respectively, (93) to polycide gate (51) and (61), and (95) to the second polysilicon electrode (80) of the dual layer capacitor as shown in FIG. 1a.

It will be known to those skilled in the art that the properties of the patterned insulator layer (70)—also known as inter-poly oxide (IPO)—as well as its thickness, play a significant role in determining the storage capacity of capacitors, in general. Thus, IPO (70) is usually very thin and is formed of a dielectric material selected from a group consisting of silicon oxide, silicon nitride, and silicon oxynitride. IPO is sometimes characterized as a high temperature oxide (HTO) and is deposited by chemical vapor deposition and later densified at even higher temperatures.

Conventional capacitor structures such as shown in FIG. 1a and some associated problems are discussed by Chang, et al in U.S. Pat. No. 5,631,188. Chang essentially follows the same process steps of fabricating a polysilicon capacitor which are shown diagrammatically in FIG. 1b. Namely, in step (110), a substrate with active and passive regions is provided. Gate oxide is next thermally grown, followed by the blanket deposition of a first polysilicon layer and a refractory metal (step (150)). The blanket layers are then patterned and etched (step (151)) to form simultaneously FET gate (1) and the first electrode of the dual layer capacitor (2) shown in FIG. 1a. Refractory metal residing over gate (51) and first polysilicon electrode (51') is next silicidated by subjecting it to heat. Using the silicidated areas as a mask, source/drain regions are formed through implantation of impurities. In step (170), a thin layer of IPO is deposited followed by the depositing of the second polysilicon layer in step (180). Further processing takes place in steps (175) and (190) to complete the circuit, where ILD is deposited and interconnections are made to the source/drain regions, to the gate and to the dual layer capacitor.

Chang in U.S. Pat. No. 5,631,188 cites the problem of delamination between the patterned silicide cap (61') and the patterned first polysilicon layer (51') of prior art, and teaches a method of forming the silicide independent of the polysilicon layer so as to prevent the delamination. He also proposes a method of forming a low voltage coefficient capacitor within an integrated circuit. (It is generally known that voltage coefficients of less than 50 ppm/V are desirable). Lavene, on the other hand, teaches a method for making metallized capacitor having increased dielectric breakdown voltage in U.S. Pat. No. 5,641,111. Hashizume, et al, propose in U.S. Pat. No. 5,604,145, a method to improve capacitances of capacitors in a DRAM. Tang, et al., in U.S. Pat. No. 5,010,032 address the problem of counter-diffusion of dopants, that is, impurities, through connections between p+ and n+ polysilicon levels in a mixed mode CMOS device which includes metal silicides and nitride interconnects, especially in the ULSI technology where the interconnect lengths are very short and still shrinking, thus bringing the differently doped areas ever closer together.

A problem that is not addressed in prior art concerns the degradation of the silicide metal at the time of interpoly (IPO) deposition (step (170)) after the silicidation step (160). It is found in the present line of manufacturing that the degraded silicide metal can contribute to higher resistivity of the polysilicon electrodes, high voltage coefficient and space-charge capacitance of the dual layer capacitor, as well as to the counterdiffusion of dopants between mixed, that is, analog/digital devices. It is disclosed in the embodiments of this invention that these problems can be alleviated.

SUMMARY OF THE INVENTION

It is therefore an object of this invention to provide a silicide process for mixed mode, analog/digital devices.

It is another object of this invention to provide a method of forming low resistance polycide contact.

It is still another object of this invention to provide a method of forming a dual layer capacitor of low voltage coefficient and low space-charge capacitance.

It is yet another object of this invention to provide a method of forming low resistance local polysilicon interconnect.

It is a further object of this invention to provide a method of forming a high-value polysilicon resistor for a mixed mode device.

These objects are accomplished by providing a silicon substrate having gate oxide and field oxide and forming thereon analog/digital circuits. In the first embodiment, the first polysilicon (poly-Si) electrode is formed simultaneously with poly-Si gate. Silicidation is deferred until after a dual layer capacitor is formed with a capacitor protective oxide (CPO) over it. The CPO is patterned with an opening over the FET device area while covering the capacitor. Silicidation is next performed to form polycide gate and silicide contacts over the source/drain (S/D) regions. Thus, the detrimental effects of hot temperature process steps of forming the capacitor on the silicide integrity is circumvented by deferring the silicidation until after the forming of the capacitor.

In a second embodiment, a local poly-Si interconnect is formed simultaneously with the forming of the second poly-Si electrode, or top plate, of the dual layer capacitor. The process steps of the first embodiment is modified in forming the CPO mask in that now an opening is allowed for the local interconnect so that its second poly-Si is silicidated at the same time the first poly-Si over the gate and S/D is silicidated. In this manner, a low resistance poly-Si local interconnect is formed with no additional steps.

In the third embodiment, a high-value poly-Si resistor is formed simultaneously with the forming of the second poly-Si electrode. In this instance, the CPO mask is formed to protect the resistor as well as the capacitor during silicidation of the digital device. In this manner, a high-value resistor component of the analog device is formed simultaneously with the forming of the second polysilicon electrode, without additional steps.

BRIEF DESCRIPTION OF THE DRAWINGS

FIG. 1a is cross-sectional view of a substrate showing the physical structure of an FET device and a dual layer capacitor formed in a mixed mode, analog/digital integrated circuit chip of prior art.

FIG. 1b is a diagram showing the steps of fabricating the mixed mode devices of FIG. 1a with a silicidation process of prior art.

DESCRIPTION OF THE PREFERRED EMBODIMENTS

Figure 2A:
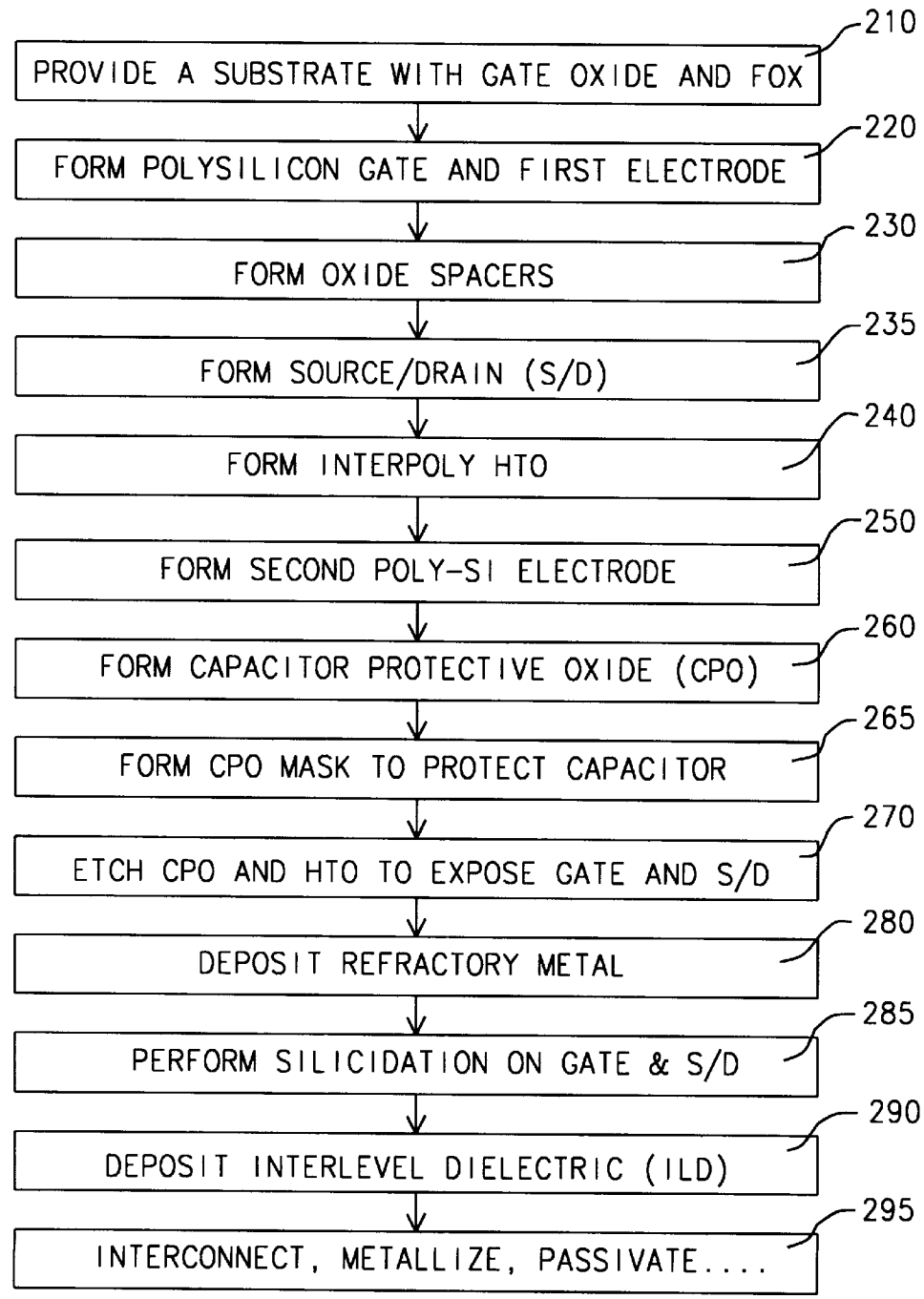
FIG. 2a is a diagram showing the steps of fabricating an FET device and a dual layer capacitor with the silicidation process of this invention.
Figure 3:
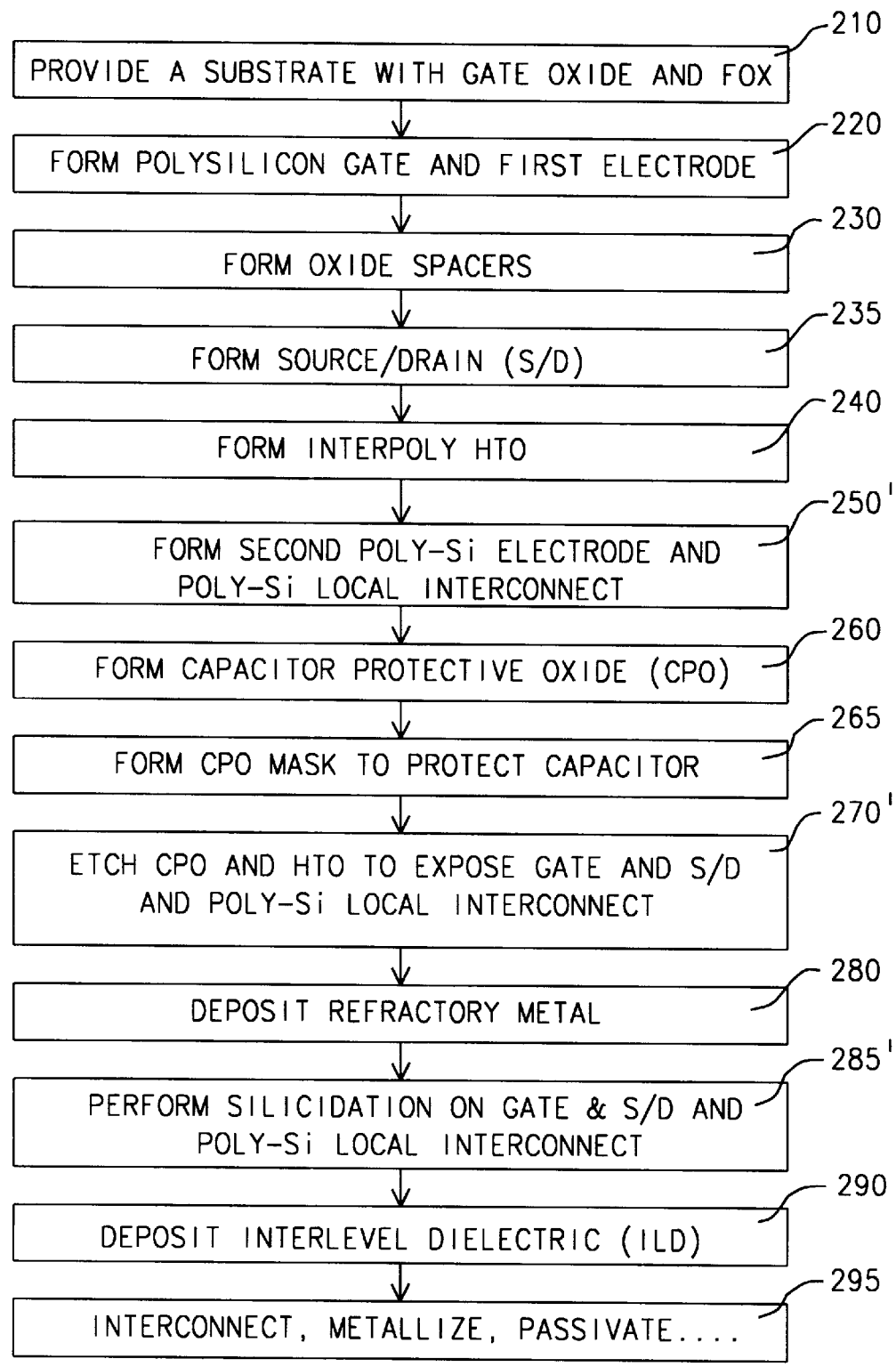
FIG. 3 is a diagram showing the steps of fabricating an FET device and a local polycide interconnect simultaneously with the forming of the second poly-Si electrode of a dual layer capacitor using the silicidation process of this invention.
Figure 4:
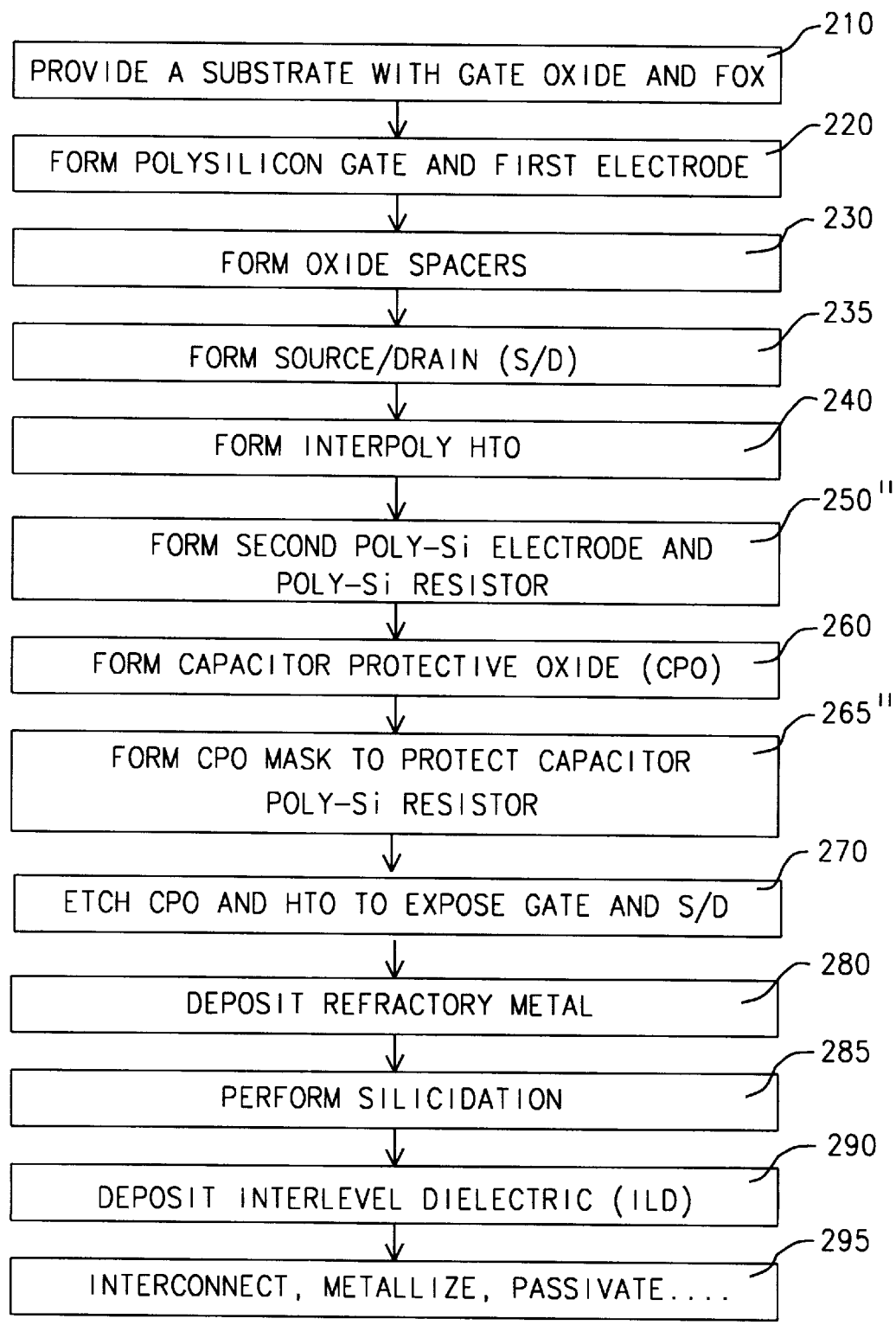
FIG. 4 is a diagram showing the steps of fabricating an FET device and a high-value poly-Si simultaneously with the forming of the second poly-Si electrode of a dual layer capacitor using the silicidation process of this invention.

The process steps of the first embodiment of this invention are disclosed in FIG. 2a, and the various results of performing these steps are shown by cross-sectional views of substrate (310) of FIGS. 2b–2f corresponding to those process steps. The process steps for the second and third embodiments are depicted in FIGS. 3 and 4.

A main feature and key aspect of this invention is the deferral of the step of forming of silicide metal (step (285)) until after the forming of the interpoly oxide (IPO) film from a high temperature oxide (HTO) in step (240). It will be evident from the following process steps that by performing the silicidation after the forming of HTO, the detrimental effects of high temperature deposition and densification of the HTO on the silicide metal are avoided. The IPO disclosed in this invention has improved capacitive dielectric properties and is a thin, high temperature oxide (HTO) requiring densification upwards of 800° C. or more. It is believed that such high temperatures have a degrading effect on refractory silicides.

Referring now in particular to FIG. 2a, and FIGS. 2b–2f, the various process steps in FIG. 2a are correlated with the corresponding structural views through the last two digits of the reference numerals. Thus, the substrate provided in step (210) of FIG. 2a is referenced with numeral (310) in FIG. 2b. Some additional reference numerals may be given in the structural views but without necessarily having the corresponding numerals in FIG. 2a so as to not obscure the key steps of the process steps. Thus, substrate (310) is provided with field oxide isolation regions (311) and gate oxide (312) in FIG. 2b which are formed through methods and materials that are known in the art. It is preferred that the thickness of the gate oxide is between about 30 to 100 angstroms (Å).

Figure 2B:
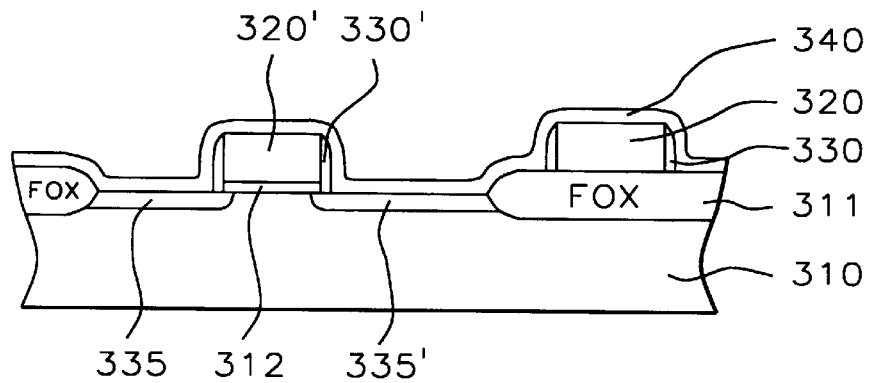
FIGS. 2b–2f are cross-sectional views of a substrate processed through the steps of FIG. 2a according to this invention.

On the substrate provided as shown in FIG. 2b, a first layer of polysilicon is formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials. In this embodiment of the present invention, it is preferred that the first polysilicon layer is formed through a LPCVD employing silane as a silicon source material, although other methods and materials may be employed. Preferably the thickness of the blanket first polysilicon layer is between about 1500 to 3000 angstroms (Å). After deposition, the first polysilicon layer is patterned (step (220) in FIG. 2a) to form gate electrode (320') and first electrode (320) of a dual layer capacitor simultaneously, as shown in FIG. 2b. The patterning may be accomplished through methods including but not limited to photolithographic methods followed by wet chemical etching methods and dry plasma Reactive Ion Etch (RIE) etch methods.

At the next step (230), oxide spacers (330) and (330') are formed in preparation for silicidation at a later step (285). Oxide spacers are formed adjacent to the polysilicon sidewalls by first blanket depositing a layer of oxide (not shown) and then masking and etching anisotropically so that oxide layer is removed from everywhere except those portions (330) and (330') near the edges of the polysilicon gate (320) and first polysilicon electrode (320'), respectively. The oxide spacers primarily serve to prevent the shorting of gate (320') with the active areas (335) and (335') when a metal layer is deposited later in preparation for the silicidation step (285). It is, therefore, preferred that the thickness of the oxide spacers is not less than between about 1000 to 3000 Å. It will be apparent then that spacers (330) adjacent to the sidewalls of the first electrode (320) are not needed since there is no possibility of having metal adjacent to the electrode with which to short.

Following the formation of oxide spacers, source/drain regions are formed in step (235) by implanting, preferably, arsenic at a dosage level between about $2 \times 10^{15}$ to $7 \times 10^{15}$ atoms/cm$^2$ at an energy level between about 50 to 55 KEV. The source/drain regions are shown by reference numerals (335) and (335') in FIG. 2b.

An important step in the process flow of FIG. 2a is the forming of a high temperature oxide (HTO) film as an interpoly oxide between the two polysilicon electrodes of the dual layer capacitor of FIG. 2b. It is preferred that HTO layer (340) shown in FIG. 2b is deposited in step (240) of FIG. 2a at a temperature between about 800 to 850° C. by the reaction of, but not limited to, dichlorosilane and nitrous oxide, and with a thickness between about 350 to 400 angstroms (Å) and low dielectric constant between about 3.5 to 4.2.

Figure 2C:
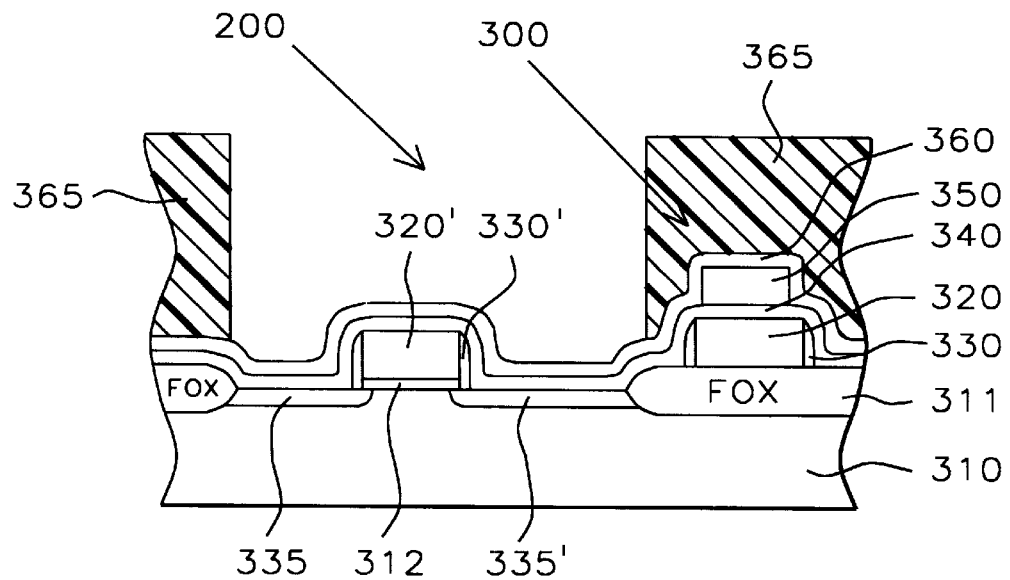
Figure 2D:
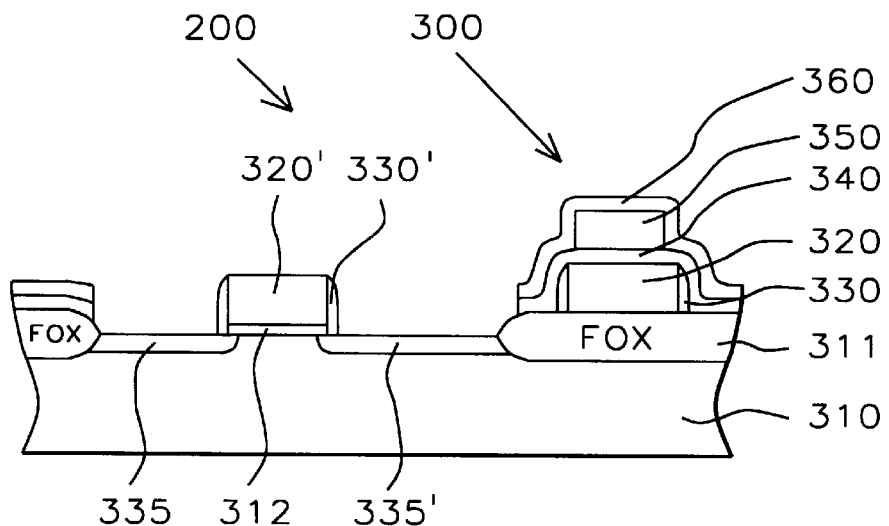

The second polysilicon electrode (350) shown in FIG. 2c is next formed and patterned over the HTO film in step (250) through methods analogous to the methods employed in forming and patterning the first polysilicon electrode in step (220) of FIG. 2a. Both first and second polysilicon layers are in-situ doped with phosphorous during poly deposition.

Another important step (step (260)) is the forming of a capacitor protective oxide (CPO) film (360) covering the dual layer capacitor shown in FIG. 2c. CPO is formed by the decomposition of tetraethyl orthosilicate at low pressure (LPTEOS) or it may be plasma enhanced (PE)-oxide, and has a thickness between about 3000 to 5000 Å. CPO will serve as a mask over the dual layer capacitor when silicidation is performed later in step (285).

A CPO mask is formed in step (265) by first depositing a layer of photoresist (365) to a thickness between about 1 to 1.2 micrometers ($\mu$m) and then patterning it with an opening over the FET device are (200) as shown in FIG. 2c while making or covering the underlying dual layer capacitor shown in the same Figure. Subsequently, in step (270), CPO and HTO layers (360) and (340), respectively, are etched, preferably by reactive ion etch (RIE) methods, thus exposing the polysilicon gate (320') and the surfaces above the source/drain regions (335) and (335') shown in FIG. 2d. Photoresist layer (365) is then removed.

Figure 2E:
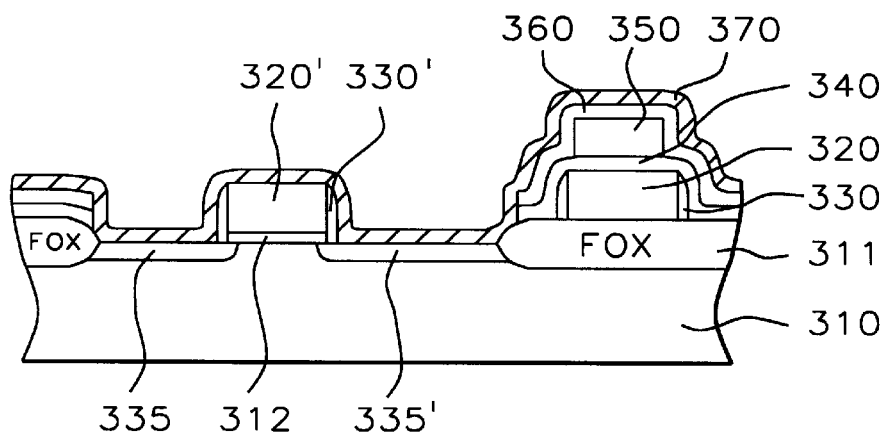
Figure 2F:
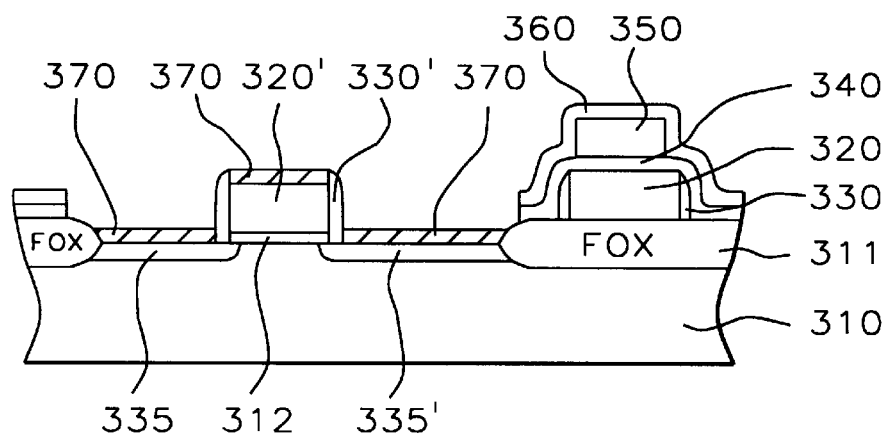

The deferred silicidation step (285) of FIG. 2a now starts with the sputter deposition (step (280)) of a refractory metal, preferably titanium (Ti), at a thickness between about 200 to 1000 Å over the substrate shown in FIG. 2e. Subsequently, titanium is heated to a temperature between about 700 to 710° C. to react with the exposed silicon areas of the source and drain, as well as the polysilicon areas on the gate to form titanium silicide (TiSi$_2$). It will be noted that oxide spacers (330') prevent the gate and source/drain areas from being connected by avoiding silicide formation on this oxide. Similarly, no reaction takes place between titanium and the capacitor protective oxide (CPO) over the dual layer capacitor, and a selective etch removes the unreacted metal without attacking the silicide on the gate and source/drain areas as shown in FIG. 2f. It is preferred that the selective-etch recipe comprises NH$_4$OH, H$_2$O$_2$ and H$_2$O. As a final step in silicidation, the silicide layer is annealed in a rapid thermal annealer (RTA) at a temperature between about 850 to 880° C.

Further processing steps (290) and (295) take place to complete the circuit, by forming interlevel dielectric layer, opening contact holes, metallization and passivation, which are not shown here for brevity.

It will be noted above that the problem of degradation of silicide contacts have been circumvented by deferring the silicidation process until after the forming of the high temperature oxide (HTO) as an interpoly (IPO) layer between the two electrodes of the dual layer capacitor. At the same time, the adverse effects of the silicidation process on the capacitor has been alleviated by protecting the capacitor by a capacitor protective oxide (CPO).

The silicidation process that is deferred until after the formation of the second or top plate of the dual layer capacitor can also be used to advantage in a second embodiment that is shown diagrammatically in FIG. 3. The process steps in FIG. 3 are the same as in FIG. 2a until step (250) is reached. In the second embodiment, however, simultaneous with the second polysilicon electrode formation, an internal local polysilicon (poly-Si) interconnect at some other location on the same chip is also formed (step (250')) in FIG. 3). This is followed by the forming of CPO as in the first embodiment of FIG. 2a (step (260)). In the next step (265), the CPO mask is modified to allow for an opening where local polysilicon interconnect will be silicidated. In this manner, when the CPO and HTO are etched in the next step (270'), the local interconnect along with gate and source/drain areas is also exposed to receive refractory metal and therefore, silicidated (step (285')). Thus, a low resistance polycide local interconnect is formed by simply incorporating it into the design and process steps shown in FIG. 3 without any additional steps. (The modified process steps of the second embodiment of this invention are shown with primed reference numerals in FIG. 3.)

The step of forming second polysilicon layer (step (250) of FIG. 2a) can be used to even further advantage in still another, third embodiment, but with selective silicidation in this instance. It will be known to those in the art that analog functions also require passive circuit components (which preferably also exhibit small voltage coefficient) such as resistors. Resistors fabricated in polysilicon are preferred for precision applications because they exhibit smaller temperature coefficients than do resistors made in diffused regions of the substrate. Thus, for a mixed mode process, step (250) is modified to form polysilicon resistor simultaneously with the forming of the second polysilicon electrode, or top plate of the dual layer capacitor (300) shown in FIG. 2c. This modified step is shown as (250") in FIG. 4. (Modified steps for the third embodiment are shown with double primed reference numerals in FIG. 4).

Because high-valued resistors are usually required as load devices, it will be apparent that silicidation should not be used. Thus in step (265"), CPO mask is formed to protect both the capacitor and the resistor. The subsequent steps (280) through (295) remain the same as before.

While the invention has been particularly shown and described with reference to the preferred embodiments thereof, it will be understood by those skilled in the art that various changes in form and details may be made without departing from the spirit and scope of the invention.

What is claimed is:

1. A method of forming low resistance silicide for a mixed mode, analog/digital device comprising the steps of:
   providing a substrate having gate oxide and field oxide regions;
   depositing a first polysilicon layer over said substrate;
   patterning said first polysilicon layer to form a gate of an FET device and first electrode of a dual layer capacitor;
   forming oxide spacers adjacent to sidewalls of said gate and first electrode;
   forming source/drain regions in said substrate;
   depositing interpolysilicon oxide (IPO) over said substrate;
   depositing a second polysilicon layer over said IPO;
   patterning said second polysilicon layer to form a second electrode of said dual layer capacitor and a polysilicon resistor;
   depositing a capacitor protective oxide (CPO) over said dual layer capacitor and said polysilicon resistor;
   forming a CPO mask with a window over said FET device area and a region to protect said dual layer capacitor and said polysilicon resistor;
   etching said CPO and said IPO through said window to expose said FET device area;
   removing said CPO mask;
   depositing metal over said FET device area;
   performing silicidation of said metal over said FET device area;
   removing unreacted portions of said metal;
   depositing an interlevel dielectric; and
   performing process steps to complete the fabrication of said mixed mode device.

2. The method of claim 1, wherein said substrate is silicon.

3. The method of claim 1, wherein said gate oxide has a thickness between about 30 to 100 angstroms (Å).

4. The method of claim 1, wherein said depositing a first polysilicon layer is accomplished with LPCVD employing silane as a silicon source material.

5. The method of claim 4, wherein said first polysilicon layer has a thickness between about 1,500 to 3,000 (Å).

6. The method of claim 1, wherein said patterning said first polysilicon layer is accomplished with dry plasma reactive ion etch (RIE).

7. The method of claim 1, wherein said oxide spacers have a thickness between about 1000 to 3000 Å.

8. The method of claim 1, wherein said forming source/drain regions is accomplished by implanting arsenic at a dosage level between about $2 \times 10^{15}$ to $7 \times 10^{15}$ atoms/cm$^2$ at an energy level between about 50 to 55 KEV.

9. The method of claim 1, wherein said depositing interpolysilicon oxide is accomplished by depositing a hot temperature oxide (HTO) at a temperature between about 800 to 850° C. by the reaction of dichlorosilane and nitrous oxide.

10. The method of claim 9, wherein said IPO has a thickness between about 350 to 400 Å.

11. The method of claim 1, wherein said depositing a second polysilicon layer is accomplished with LPCVD employing silane as a silicon source material.

12. The method of claim 11, wherein said second polysilicon layer has a thickness between about 1,500 to 3,000 (Å).

13. The method of claim 1, wherein said capacitor protective oxide (CPO) is a LPTEOS or PE-oxide.

14. The method of claim 13, wherein said CPO has a thickness between about 3000 to 5000 Å.

15. The method of claim 1, wherein said CPO mask comprises a photoresist having a thickness between about 1 to 1.2 micrometers ($\mu$m).

16. The method of claim 1, wherein said etching said CPO and said HTO is accomplished by reactive ion etching (RIE).

17. The method of claim 1, wherein said depositing metal is accomplished by sputtering titanium.

18. The method of claim 17, wherein said titanium has a thickness between about 200 to 1000 Å.

19. The method of claim 1, wherein said silicidation is accomplished by heating said titanium to a temperature between about 700 to 710° C.

20. The method of claim 1, wherein said removing unreacted portions of said metal is accomplished with a selective-etch recipe comprising $NH_4OH$, $H_2O_2$, $H_2O$.).

21. The method of claim 1, wherein said process steps to complete the fabrication of said mixed mode device comprise metallization and passivation.

* * * * *